PREPARING GROUP II-VI COMPOUND SEMICONDUCTOR DEVICES

Filed April 13, 1965

INVENTORS
WILLIAM N. HAMMER
JOSEPH A. KUCZA
GERALD MANDEL
FREDERICK F. MOREHEAD
BY Thomas J. Kilgannon Jr.
ATTORNEY

United States Patent Office 3,326,730
Patented June 20, 1967

3,326,730

PREPARING GROUP II–VI COMPOUND SEMICONDUCTOR DEVICES

Gerald Mandel, deceased, late of Croton-on-Hudson, N.Y., by Kay Mandel, legal representative, Croton-on-Hudson, N.Y., and Frederick F. Morehead, Jr., Yorktown Heights, and Joseph A. Kucza, Mount Kisco, N.Y., and William N. Hammer, Brookfield Center, Conn., assignors to International Business Machines Corporation, Armonk, N.Y., a corporation of New York Filed Apr. 13, 1965, Ser. No. 447,743
7 Claims. (Cl. 148—189)

INTRODUCTION

This invention generally pertains to highly doped semiconductor devices. More particularly, this invention pertains to a method for obtaining shallow p-type acceptor levels in Group II–VI compound devices by diffusing Group V elements into said semiconductor compounds under an atmosphere of the same Group II element that is present in the semiconductor.

BACKGROUND

Binary semiconductive compounds which can be obtained as pure single crystals are useful for the fabrication of electrical devices such as transistors, diodes, solar batteries, electroluminescent devices and injection lasers. One group of useful binary compounds consist of the sulfides, selenides, and tellurides of zinc, cadmium and mercury. This group of materials is commonly referred to as the "II–VI compounds," because the constituents of each compound comprise an element from the Column II and element from the Column VI of the periodic table. When utilized as semiconductor devices, the binary semiconductive compounds have been found to exhibit certain advantages over the elemental semiconductors (such as germanium and silicon). In particular, they exhibit increased electron mobility and improved ability to operate at high temperatures.

The semiconductive binary compounds also have certain disadvantages in device fabrication. It has been found more difficult to form a given conductivity region in a binary compound semiconductive wafer than in an elemental semiconductor wafer. Since the formation of given conductivity type regions within a semiconductor wafer is required for the fabrication of rectifying barriers, attempts have been made to utilize for this purpose those techniques, such as surface alloying, diffusion of an active impurity, and the like, which have been successful with the elemental semiconductors silicon and germanium. However, it has heretofore been found difficult to control the introduction of acceptors and donors into semiconductive compound wafers. Furthermore, for some purposes it is desirable to introduce relative larger amounts of the active impurity into the wafer, so as to form heavily doped regions within the crystal. For example, in the fabrication of tunnel diodes it is desirable that at least one region of the semiconductor wafer be heavily doped (i.e., concentrations of acceptor impurities as high as $10^{19}$ acceptor atoms per cm.$^3$). It has heretofore been very difficult to achieve such heavily doped regions (high concentrations of impurities) in binary compound wafers. It has also been thought desirable that there be shallow acceptor levels in tunnel diodes, since it has been thought that the tunneling phenomena occurs near the surface of the diode.

Binary semiconductors composed of Groups III–V compounds having acceptor concentrations of about $10^{19}$ acceptor atoms per cm.$^3$ have been prepared. This has been accomplished by heating the III–V compound, for example, as GaAs, at a temperature sufficient to cause volatilization of the more volatile element (e.g., As), and leaving the melt of the less volatile element (e.g., Ga), behind. The compound is reconstituted by reheating the less volatile element in an atmosphere of the more volatile element and an impurity element such as P. The method of doping III–V compounds would be impractical for the doping of II–VI compounds. This is because both elements in the II–VI compounds are generally of about the same volatility. Therefore the process used for doping III–V compounds, based on the volatility difference of the elements, would not be applicable.

The prior art has reported that only weak injection electroluminescence can be obtained with CdTe. In the prior art, CdTe has been doped with impurities by melting the dopant element on the surface of CdTe crystal in an N atmosphere and subsequently heating the crystal in a Cd atmosphere. Acceptor concentrations in the CdTe device prepared by this method have been found to be only of the order of $10^{16}$ acceptor atoms per cm.$^3$.

It has heretofore generally been thought that p-type acceptor levels produced in II–VI compounds by doping with Group V elements were always at a deep lying level.

OBJECTS

A primary object of this invention is to fabricate II–VI compound semiconductor devices by an improved method.

Another object of this invention is to fabricate II–VI compound semiconductor devices having higher acceptor concentrations than heretofore possible.

Yet another object of our invention is to fabricate II–VI compound semiconductor devices having stable shallow acceptor levels.

Still another object of our invention is to fabricate a II–VI compound semiconductor device, which exhibits high quantum efficiency electroluminescence from p-n junctions of the semiconductor devices.

Another object of our invention is to fabricate a II–VI compound semiconductor device exhibiting relatively temperature independent p-type conductance.

The foregoing and other objects, features and advantages of the invention will be apparent from the following more particular description of preferred embodiments of the invention, as illustrated in the accompanying drawings and examples.

THE PRESENT INVENTION

Figure 1:
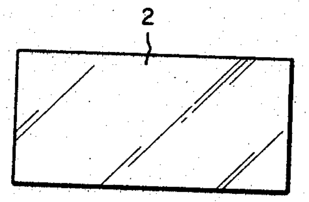
FIGS. 1–3 are sectional elevational views showing successive steps in the fabrication of a semiconductor device in accordance with the method of our invention.

Considered from one aspect, this invention is directed to a method of preparing highly doped p-type semiconductor devices composed of Group II–VI compounds; and more particularly, to a method for obtaining stable shallow p-type acceptor levels in Group II–VI compound semiconductor devices wherein a dopant selected from Group V elements is diffused into said semiconductor compounds under an atmosphere of the Group II element, and to semiconductor devices, prepared by the method of this invention, having acceptor concentrations of from $10^{19}$ to $10^{20}$ atoms cm.$^{-3}$, exhibiting substantially temperature independent p-type conductance and which also exhibits high quantum efficiency forward biased electroluminescence.

Considered from another aspect the present invention involves a method including the steps of:

(a) establishing a heating and vaporizing zone, (b) placing a semiconductor binary compound crystal in one portion of said heating and vaporizing zone, said semiconductor binary compound crystal being composed of II–VI elements, (c) placing a reservoir of diffusing material in another portion of said heating and vaporizing zone, said diffusing material being a mixture of a large proportion of the same Group II element that is in the aforesaid binary compound and a small proportion of a Group V element, (d) heating said semiconductor binary compound crystal to a temperature below its melting and dissociation points, (e) maintaining the temperature of said diffusion mixture at about 50° C. below that at which said binary crystal is heated, and (f) after a heating period of at least about one day recovering a doped semiconductor binary compound crystal having a shallow acceptor level.

(a)

The heating and vaporizing zone can take various forms depending upon the volume of production, temperature and pressure to be employed, etc. In its simplest form the heating and vaporizing zone may consist of a quartz capsule. The heating and vaporizing zone should be constructed and arranged so that one portion can be heated to a different temperature than another portion.

The pressure within the heating and vaporizing zone may vary between a small fraction of an atmosphere and several atmospheres.

(b)

A semiconductor binary compound crystal is then placed in one portion of said heating and vaporizing zone. The binary compound is a II–VI compound and is preferably selected from the group consisting of the sulfides, selenides and tellurides of zinc, cadmium and mercury. Particularly preferred is cadmium telluride.

The binary compound crystal can be substantially undoped or it can initially be doped with Al, or contain 1% P as an impurity.

(c)

A reservoir of diffusing material is then placed in another portion of said heating and vaporizing zone. The diffusing material is a mixture of a large proportion (preferably 90%–99.5%) of the same Group II element that is in the aforesaid binary compound and a small portion (preferably 0.5%–10%) of a Group V acceptor element selected from the group consisting of phosphorous, arsenic, antimony and bismuth. Said mixture is most preferably about 99% cadmium and either about 1% phosphorous or about 1% arsenic.

(It is possible that other known shallow acceptors, e.g., lithium and sodium, might be used in place of phosphorous or arsenic.)

(d)

The binary compound crystal is then heated to a temperature below its melting and dissociation points. (Reconstitution of the crystal is not required since dissociation is minimized.) The preferable temperature range is between 650° C. and 1000° C.

(e)

The diffusion mixture is heated to a temperature about 50° C. below that at which the binary compound has been heated. During the heating operation the diffusant mixture (comprising the Group V element and the Group II element) actually diffuses into the heated II–VI compound crystal. The partial pressure of the Group II element varies from about .03 to several atmospheres, depending upon the percentage of the Group V element added to the diffusant mixture.

(f)

After a heating period of at least about one day or as long as two weeks or longer, a doped semiconductor binary compound crystal is obtained. Highly efficient injection electroluminescent diodes can be prepared from materials prepared according to the above method. Devices made from the product of this invention have been found to exhibit resistivities as low as 0.1 ohm-cm.

It has been found in accordance with this invention that II–VI compounds heavily doped with a Group V compound can have shallow lying acceptor levels and acceptor concentrations as high as about $10^{19}$–$10^{20}$ acceptor atoms per $cm^3$. Shallow lying acceptor levels require smaller ionization energies (i.e., lower applied thermal energies are required in order to produce usable p-type conductivity from holes). It has been found that an external quantum efficiency of 12% in the electroluminescence of forward biased p-n junctions in CdTe (initially doped with Al) at 77° K. are obtainable when the CdTe:Al is doped with a p-type dopant, by the method of this invention. Such high quantum efficiencies have never before been reported in a II–VI homojunction.

EXAMPLES IN GENERAL

The following examples are presented in order to illustrate some of the preferred embodiments of the invention, but it should be understood that the invention is not limited thereto.

Unless otherwise specified in the following examples the undoped CdTe crystal referred to was a melt grown crystal produced in a well-known manner in a vertical Bridgman apparatus in an excess of Te, and these crystals were about 300 microns thick.

The CdTe crystals used in the examples below were slices cut perpendicularly to the (100) plane of the crystal and which have two perpendicular cleavage planes [(110)'s]. From this slice one can conveniently cleave diodes with three mutually perpendicular surfaces, producing a geometrically favorable cavity in which to obtain stimulated emission.

The sealed quartz capsules referred to are well known in the art.

*Example 1*

Figure 2:
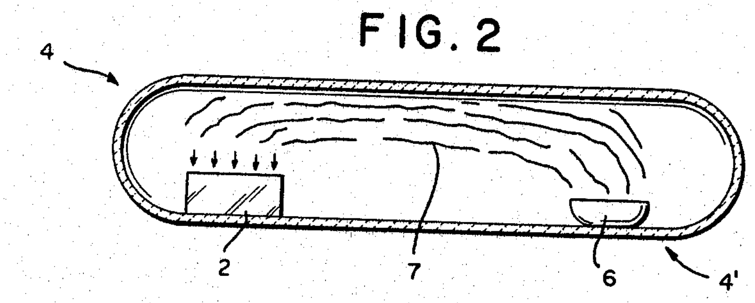
Figure 3:
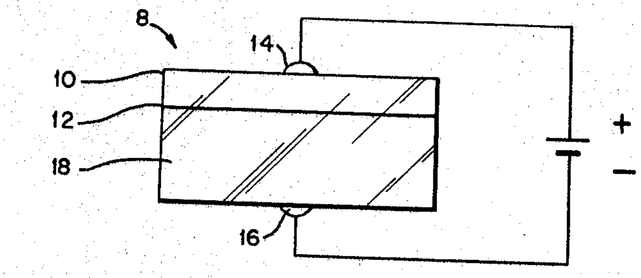

An undoped CdTe crystal 2 (FIGS. 1 and 2), was placed at one end of an evacuated sealed quartz capsule 4. At the other end of the capsule 4 was placed a reservoir 6 of a diffusion mixture consisting of 99 atom percent Cd and 1 atom percent P. The quartz capsule 4 containing both the CdTe crystal 2 and the spaced apart diffusion mixture reservoir 6 was then placed in a furnace that permits two zone heat control. The end of the capsule 4 at which the CdTe crystal 2 was placed was maintained at a temperature of about 850° C., which is considerably below the melting point of CdTe, while the other end of the capsule 4' containing the Cd-P diffusion mixture reservoir 6 was maintained at a temperature of about 800° C. It is to be noted that there was a temperature difference in the order of 50° C., which served to prevent the formation of a second phase of Cd on the surface of the CdTe crystal 2. Diffusion of Cd and P into the CdTe crystal 2 was permitted to continue for about 2 weeks. The Cd in the Cd-P diffusion mixture 6 diffused much more quickly into the CdTe crystal 2 than the P, rendering the inner portion 13 of the crystal 2 n-type by filling Cd vacancies. The surface 10 of the diffused crystal 8 (shown in FIG. 3), is p-type because of the high concentration of P, which acts as a shallow acceptor. Resistivity measurements revealed the p-type diffused crystal 8 to have a room temperature resistivity near the surface between about 0.1–1 ohm-cm.

*Example 2*

As a control experiment, a reservoir of Cd alone (in the absence of P, or other dopant) was diffused into an undoped CdTe crystal in the same manner set forth in Example 1. The resulting diffused CdTe crystal was found to have n-type conductivity corresponding to about $10^{17}$ electrons per $cm.^3$ at 300° K. Based on the theoretical considerations (see G. Mandel, Phys. Rev. 134, A1073 (1964)), the introduction of $10^{17}$ holes per $cm.^3$ into CdTe would require $10^{19}$–$10^{20}$ per $cm.^3$ of acceptor impurities. This assumption agrees with the emission spectroscopy study made on the Cd-P diffused CdTe crystal of Example 1, which indicated the presence of about $10^{19}$ per $cm.^3$ P atoms in said diffused CdTe crystal 8.

*Example 3*

The P diffused CdTe crystal 8 of Example 1 was used as a diode by making a contact 14 to the p-type portion 10 of the crystal with a layer of electroless gold or with Kester 60–40 Sn-Pb solder and Indalloy Flux #4. Indium solder was used for the contact 16 on the n-type region 18. The method for making contacts to the crystal are known in the art and are not part of our invention.

Figure 4:
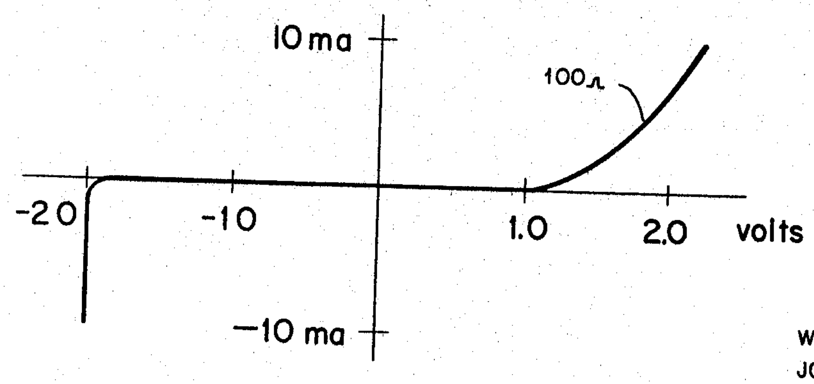
FIG. 4 is a current-voltage characteristic curve of a CdTe device having P as the acceptor impurity.

The current-voltage characteristic curve of the diode made from the product of Example 1 is shown in FIG. 4. It is to be noted that it had good diode characteristics.

The p-n junctions in the diodes occurred about 30 microns away from the surface and the average resistivity of this 30 microns thick p-type layer was about 1–10 ohm-cm. The position of the p-n junction was determined by three different methods, the results of which were in satisfactory agreement. In the first method the crystal was carefully lapped and measured with a micrometer. The measured depth at which the conductivity type (as determined by a thermoelectric probe) changed from p to n was the junction depth. In the second method, the position of the electroluminescence was determined from an infrared photomicrograph of an emitting diode. The third technique involved angle lapping through the junction and treating the surface of the crystal with "white etch" ($H_2O$, $HNO_3$, and HF). The p-type region was greyish in appearance under direct lighting while the n-type portion of the crystal appeared black.

*Example 4*

The method of Example 1 was repeated with all parameters remaining the same except that P was replaced by As in the diffusion mixture. The characteristics of diodes made from the resulting diffused crystal were essentially the same as those of Example 1.

*Example 5*

The method of Example 1 was repeated except that the temperature at which the CdTe crystal was maintained was 700° C. and the Cd-P diffusant mixture reservoir was maintained at a temperature of 650° C. The characteristics of the diodes made from the resulting diffused crystal were essentially the same as the diodes made from the diffused crystal of Example 1.

*Example 6*

The method of Example 1 was repeated except that the temperature at which the CdTe crystal was maintained was 1000° C. and the Cd-P diffusant mixture reservoir was maintained at a temperature of 950° C. The characteristics of the resulting diodes made from the resulting crystal were essentially the same as the diode made from the diffused crystal of Example 1.

*Example 7*

The method of Example 1 was repeated except that the diffusion of Cd and P was continued for only one day instead of two weeks. The characteristics of the diodes made from the resulting diffused crystals were essentially the same as the diodes of Example 1 except that the penetrating depths of the diffusant was less.

*Example 8*

An Al doped CdTe crystal was grown in a well-known manner from a melt containing $10^{19}$ atomic parts of Al and excess Te. The resistivity of this CdTe:Al crystal (containing $10^{18}$ $Al/cm.^3$) after a short firing in a Cd atmosphere for one hour at 550° C. was found to be 0.01 ohm-cm. and showed no freeze-out at 77° K.

This CdTe:Al crystal was subjected to a two week Cd-P diffusion using the same parameters that are set forth in Example 1. The resulting products yielded very excellent diodes.

When the diodes, prepared by the above method, are forward biased, electroluminescence occurs in a 200–300 A. line in the region between 8200 and 9000 A. depending on both temperature and current. No superlinearity in the light output vs. current was observed at 77° K., i.e., there was no current threshold for luminescence such as that observed in non-lasing electroluminescent GaAs. Electroluminescence from the p-n junction of these diodes exhibited an external quantum efficiency of 12% (as measured by integrating sphere techniques).

More or less detailed claims will be presented hereinafter and even though such claims are rather specific in nature, those skilled in the art to which this invention pertains will recognize that there are obvious equivalents for the specific materials recited therein. Some of these obvious equivalents are disclosed herein, other obvious equivalents will immediately occur to one skilled in the art and still other obvious equivalents could be readily ascertained upon rather simple, routine, non-inventive experimentation. Certainly no invention would be involved in substituting one or more of such obvious equivalents for the materials specifically recited in the claims. We intend that all such obvious equivalents be encompassed within the scope of this invention and patent grant in accordance with the well-known doctrine of equivalents, as well as changed proportions of the ingredients which do not render the composition unsuitable for the disclosed purposes.

What is claimed is:

1. A method for producing highly doped semiconductor devices which includes the steps of:

establishing a heating and vaporizing zone;

placing a CdTe semiconductor binary compound crystal in one portion of said heating and vaporizing zone;

placing a reservoir of diffusing material in another portion of said heating and vaporizing zone, said diffusing material being a mixture of a 90–99.5% of Cd and 0.5–10% of P;

heating said semiconductor binary compound crystal to a temperature below its melting and dissociation points and within the range of 650–1000° C.;

maintaining the temperature of said diffusion mixture at about 50° C. below that at which said binary crystal is heated; and after a heating period extending between about one day and two weeks recovering a doped semiconductor binary compound crystal having a shallow acceptor level.

2. The process of claim 1 wherein the CdTe crystal is heated at a temperature of 850° C.

3. The process of claim 2 wherein the diffusion mixture contains 1% phosphorus.

4. The process of claim 2 wherein the diffusion mixture contains 1% arsenic.

5. The process of claim 3 wherein the CdTe is initially doped with Al.

6. A method for producing highly doped semiconductor devices which includes the steps of:

establishing a heating and vaporizing zone;

placing a semiconductor binary compound crystal in one portion of said heating and vaporizing zone, said semiconductor binary compound crystal being composed of II–VI elements;

placing a reservoir of diffusing material in another portion of said heating and vaporizing zone, said diffusing material being a mixture of 90–99.5% of the same Group II element that is in the aforesaid binary compound and 0.5–10% of a Group V element;

heating said semiconductor binary compound crystal to a temperature below its melting and dissociation points and within the range of 650–1000° C.;

maintaining the temperature of said diffusion mixture at about 50° C. below that at which said binary crystal is heated; and after a heating period of at least about 1 day recovering a doped semiconductor binary compound crystal having a shallow acceptor level.

7. A method for producing highly doped semiconductor devices which includes the steps of:

establishing a heating and vaporizing zone;

placing a semiconductor binary compound crystal in one portion of said heating and vaporizing zone, said semiconductor binary compound crystal being selected from the group consisting of the sulfides, selenides and tellurides of zinc, cadmium and mercury;

placing a reservoir of diffusing material in another portion of said heating and vaporizing zone, said diffusing material being a mixture of a large proportion of the same Group II element that is in the aforesaid binary compound and a small proportion of a Group V element selected from the group consisting of phosphorus, arsenic, antimony and bismuth;

heating said semiconductor binary compound crystal to a temperature below its melting and dissociation points and within the range of 650–1000° C.;

maintaining the temperature of said diffusion mixture at about 50° C. below that at which said binary crystal is heated; and after a heating period extending between about 1 day and 2 weeks recovering a doped semiconductor binary compound crystal having a shallow acceptor level.

References Cited

UNITED STATES PATENTS

| | | | |
|---|---|---|---|
| 3,033,791 | 5/1962 | De Nobel | 252—623 |
| 3,118,094 | 1/1964 | Connelson | 148—189 X |
| 3,218,203 | 11/1965 | Ruehrwein | 252—62.3 X |

HYLAND BIZOT, *Primary Examiner.*